(12) United States Patent
Kosmowski (10) Patent No.: US 6,174,271 B1
(45) Date of Patent: Jan. 16, 2001

(54) HIGH THROUGHPUT HOLE FORMING SYSTEM WITH MULTIPLE SPINDLES PER STATION

(75) Inventor: Wojciech B. Kosmowski, San Juan Capistrano, CA (US)

(73) Assignee: Electro Scientific Industries, Inc., Portland, OR (US)

( * ) Notice: Under 35 U.S.C. 154(b), the term of this patent shall be extended for 0 days.

(21) Appl. No.: 09/310,055

(22) Filed: May 11, 1999

Related U.S. Application Data (62) Division of application No. 08/815,375, filed on Mar. 9, 1997, now Pat. No. 5,920,973.

(51) Int. Cl.[7] .................... B23Q 3/157; B23B 35/00; B23C 3/00

(52) U.S. Cl. .................. 483/1; 29/26 A; 408/1 R; 409/13 Z; 483/31

(58) Field of Search .................. 483/1, 30, 36, 483/55, 56, 31, 8, 7; 408/1 R, 43, 46, 50, 91, 3; 409/132, 159, 190, 192, 235, 131; 29/26 A (56) References Cited

U.S. PATENT DOCUMENTS

| | | | |
|---|---|---|---|
| 2,080,643 | 5/1937 | Walther | 77/63 |
| 2,393,696 | 1/1946 | Kraut et al. | 29/26 |
| 2,886,988 | 5/1959 | Gordon | 77/22 |
| 3,822,958 | 7/1974 | Lewis | 408/46 |
| 3,882,958 | 5/1975 | Hosaka Akio et al. | 180/105 E |
| 4,088,417 | 5/1978 | Kosmowski | 408/1 BD |

(List continued on next page.)

FOREIGN PATENT DOCUMENTS

| | | | |
|---|---|---|---|
| 59-97804 | * 6/1984 | (JP) | 409/131 |

OTHER PUBLICATIONS

IBM Technical Disclosure Bulletin vol. 31 No. 11 Apr. 1989 "Gridless Printed Circuit Board Drilling Machine".
IBM Technical Disclosure Bulletin vol. 33 No. 1A Jun. 1990 "Method for Beveling Edges of Populated Printed Wiring Boards and Beveling Machine".
IBM Technical Disclosure Bulletin vol. 37 No. 6B Jun. 1994 "Multi–Head Optical Router/Drill Machine".
European Search Report, Application No. EP 98 30 1681 dated Feb. 21, 2000.
Brochure for MULTIFOR 17, "A High Productivity Drilling Machine Specifically Designed For Processing Small Lots", 4 pages.
Correspondence dated Dec. 15, 1999 from Stutzer to Joseph L. Reinhart ( 2 pages).
Correspondence dated Oct. 21, 1999 from Stutzer to Kosmowski ( 2 pages).
Report Document, Posalux SA, 4 pp., dated Feb. 27, 1996 (in German).
Translation from German, of Report Document, Posalux SA, dated Feb. 27, 1996.

* cited by examiner

Primary Examiner—William Briggs
(74) Attorney, Agent, or Firm—Larry K. Roberts (57) ABSTRACT

A high throughput drilling system for printed circuit board hole formation. Two spindles are disposed at each spindle station, doubling the number of holes produced in a given time period. Each spindle in connected to an overhead linear drive by a mini slide. A first set of the spindles, one for each spindle station, is driven by a first X axis linear drive. A second set is driven by a second X axis linear drive. The work piece table is elongated to support work pieces for all stations, and is supported by a set of bearing guides, with outrigger bearings coupled to the table by flexure mounts that relieve stress due to differential temperature expansion rates between the work piece table and the base table. High speed spindles are employed to obtain higher productivity, with larger holes routed by router tools, eliminating the need for stocking large drill sizes on the system tool changer.

10 Claims, 10 Drawing Sheets

U.S. PATENT DOCUMENTS

| | | | |
|---|---|---|---|
| 4,520,551 | 6/1985 | Imhof | 29/568 |
| 4,596,067 | 6/1986 | Raiteri | 29/568 |
| 4,654,956 | 4/1987 | Reed et al. | 29/568 |
| 4,730,373 | 3/1988 | Senoh | 29/26 A |
| 4,761,876 | 8/1988 | Kosmowski | 29/568 |
| 4,786,216 | 11/1988 | Kitagawa et al. | 408/69 |
| 4,793,745 * | 12/1988 | Ashbaugh | 408/1 R |
| 4,850,754 | 7/1989 | Thornton et al. | 408/35 |
| 4,865,494 | 9/1989 | Gudow | 408/13 |
| 4,982,831 | 1/1991 | Irie et al. | 198/617 |
| 5,068,958 | 12/1991 | Kosmowski | 29/568 |
| 5,075,530 | 12/1991 | Lee | 219/69.11 |
| 5,097,390 * | 3/1992 | Gerrie | 409/132 X |
| 5,230,685 | 7/1993 | Christen et al. | 483/55 |
| 5,497,980 * | 3/1996 | Chick | 409/131 X |
| 5,529,441 | 6/1996 | Kosmowski et al. | 408/1 R |
| 5,584,788 * | 12/1996 | Piovano | 483/37 |
| 6,071,219 * | 6/2000 | Cook | 483/1 |

HIGH THROUGHPUT HOLE FORMING SYSTEM WITH MULTIPLE SPINDLES PER STATION

CROSS-REFERENCE TO RELATED APPLICATIONS

This application is a division of application Ser. No. 08/815,375, filed Mar. 9, 1997 U.S. Pat. No. 5,920,973.

TECHNICAL FIELD OF THE INVENTION

This invention relates to the field of high speed drilling systems of the type used in the fabrication and population of printed circuit boards, and more particularly to a high throughput drilling system with multiple spindles per station.

BACKGROUND OF THE INVENTION

Printed circuit boards are typically populated with many surface-mounted circuit devices. Many small holes are formed in the boards to interconnect the layers of the circuit board. Of course, printed circuit board populated with other types of devices also need holes formed in the boards.

Drilling machines are typically used to drill the holes in the printed circuit boards. One exemplary type of system is described in U.S. Pat. No. 4,761,876, the entire contents of which are incorporated herein by this reference.

There has been a dramatic increase in the hole count on printed circuit boards, which makes the cost of drilling the holes a significant part of the total production cost. In addition, hole sizes are getting smaller. Small drills are more expensive and can not be fed with the same velocity as larger drills. Due to this fact, drilling time and cost are further increased.

It is known the multiple spindles can be employed in a drilling system, wherein the spindles are manually positioned in relation to each other. Manual positioning has the drawback of requiring significant setup time, to properly position the spindles. Moreover, each time the spindles are required to drill a new part or image, the spindles must be manually repositioned. This requires a very significant setup time as well.

Methods of producing holes by laser are known. However, laser technology does not offer a solution for producing large holes and holes through multilayer boards.

It would therefore be an advance in the art to provide a high throughput drilling system with increased throughput capacity, and which is capable of forming small as well as larger holes.

It would further be an advance in the art to provide a machine capable of mechanically forming larger as well as smaller holes with high throughput.

SUMMARY OF THE INVENTION

A high throughput hole forming system with multiple spindles per spindle station is described. The system includes a base table and a work piece table for supporting work pieces under process. A first drive system moves the work piece table along a Y axis in relation to the base table. The system includes a plurality of spindle stations, each for processing at least one work piece. A plurality of sets of spindles are provided, each spindle for holding a hole forming tool. Each set includes a spindle at each spindle station. Each set of spindles is bearing mounted on a common linear bearing for linear movement along an X axis which is transverse to the Y axis. The spindles of each set are commonly connected together to form a ganged spindle set. The system further includes a plurality of computer-controllable spindle linear drive systems each for commonly driving a set of the spindles along the X axis. A Z axis drive system is provided for individually driving the spindles along a Z axis which is transverse to the X and Y axis.

The system further comprising a controller for controlling said drive systems to conduct hole forming operations on a plurality of work pieces located at respective ones of the spindle stations, such that a spindle of each set is operated to conduct hole forming operations simultaneously on a single work piece at a given station.

In accordance with another aspect of the invention, a method is described for forming holes in a work piece, comprising a sequence of the following steps:
  providing a spindle capable of very high rotational drive rates and a linear drive, for rotating a tool and feeding the tool into and out of a work piece;
  providing a selection of tools including a set of drilling tools of various diameters, and at least one router tool;
  using one or more tools of the set of drilling tools to drill a set of holes in a work piece having diameters less than a predetermined threshold size; and
  using said router tool to form one or more holes of diameters larger than the threshold in a routing operation.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
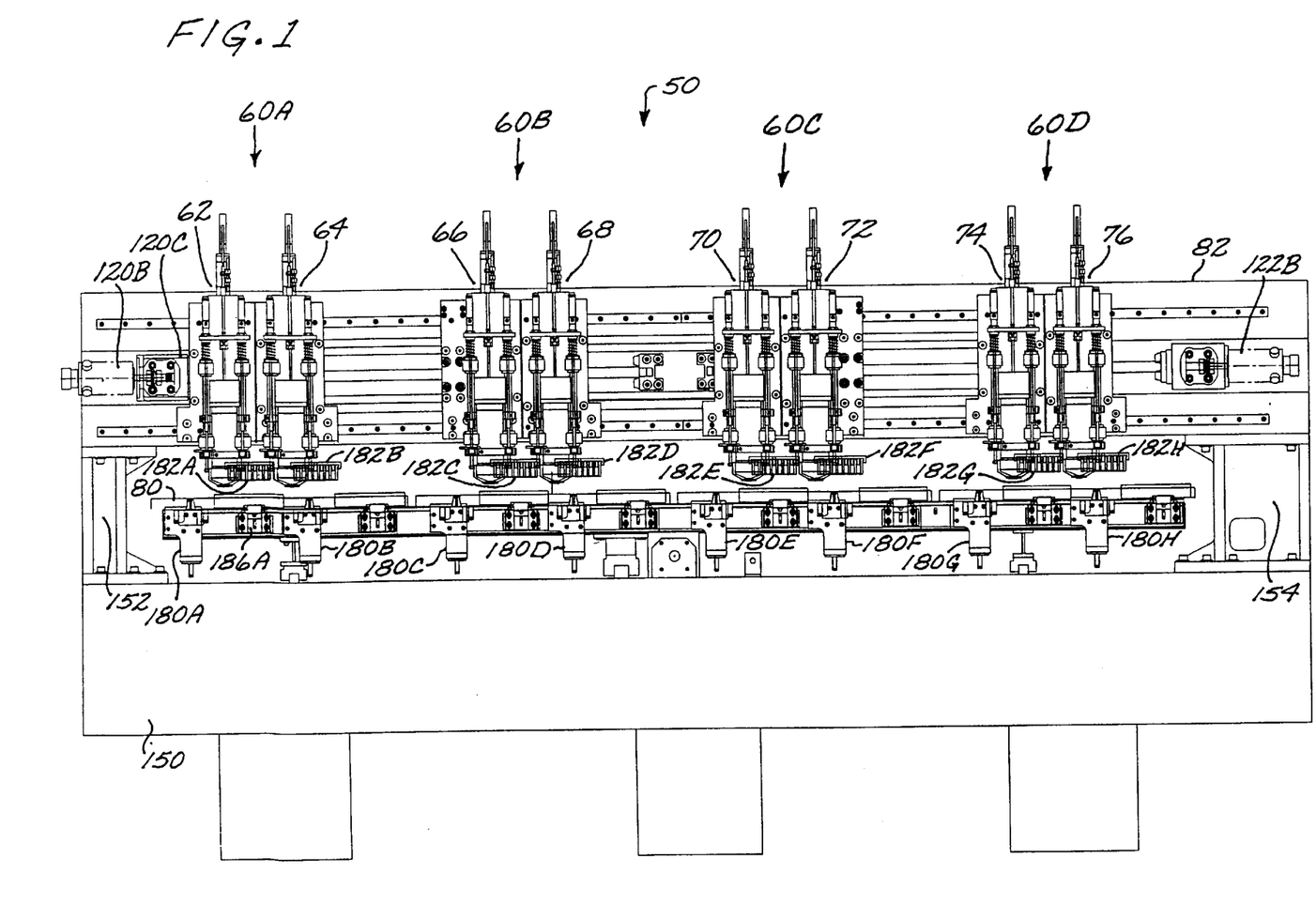
FIG. 1 is a front view of a multiple spindle per station drilling system embodying the invention.

In accordance with one aspect of the invention, a multiple spindle per station drilling system is described. An exemplary embodiment is illustrated in FIG. 1 as drilling system 50, and provided two spindles per station. Using two spindles per station produces a large gain in productivity over conventional systems, since the same number of holes can be produced in half the time, assuming that multiple images are used in producing the board. Multiple images on a board represents the norm, not the exception, in today's production of printed circuit boards. Therefore, adding a second spindle to each station will contribute significantly to machine productivity. There are additional benefits to utilizing this type of new system architecture. For example, the number of tool change cycles can be reduced by 50%, because the two spindles are changing drills at the same time.

This invention is not limited to applications employing two spindles per spindle station, as it is contemplated that three, four, six or more spindles per station can be employed, each with an independent X-axis drive system.

A problem in a multiple-spindle per station approach is the increased complexity of the system, making it difficult to obtain low cost objectives. In accordance with another aspect of the invention, the system employs a set of mini slides, each carrying one spindle each, connected by push rods, to allow a single servo drive to position four spindles along the X axis. A second set of mini slides and servo drive is used to position a second set of four spindles along the X axis. All eight mini slides travel on a pair of rails attached to the overhead beam of the system. This simplifies the X positioning system to make the multiple-spindle per station architecture economically feasible, and improves machine dynamics by reducing moving mass dramatically. Moreover, because the spindles for each station often are moved in opposite directions, the respective movements tend to cancel the acceleration forces set up in moving the spindles and thus help to stabilize the machine.

FIG. 1 shows a drilling system 50 embodying the multiple-spindle per station architecture in accordance with the invention. In this exemplary embodiment, the system has four stations 60A–60D, and each station is served by two spindles each. Thus, in this embodiment, spindles 62 and 64 serve station 60A, spindles 66 and 68 serve station 60B, spindles 70 and 72 serve station 60C, and spindles 74 and 76 serve station 60D. The spindles can be moved by spindle drive systems up and down along the Z axis under control of the system controller to feed the drilling tool into and out of the work pieces, which are carried on a table 80, shown generally in the side view of FIG. 2. The drilling system 50 further includes a table drive for moving the work piece table 80 along the Y axis. The spindles are mounted on slides carried on the overhead beam 82 for movement along the X axis. All the foregoing elements are supported on a granite base table 150, with the overhead beam 82 supported above the base table and the work piece table 80 by left and right uprights 152 and 154.

As further shown in FIG. 1, the system 50 employs a system of grippers and tool magazines adapted to permit automated tool changing of the tools put to use by each spindle. The grippers 180A–180H are carried along the forward edge of the table 80 in a spaced arrangement, with one gripper being provided for each spindle. Each spindle also has mounted thereto a tool magazine, which is therefore also positionable in X-axis by the X-axis drive system, and in the Z-axis by the spindle Z-axis drive. By coordinated movement of the table drive, the X-axis drive and the Z-axis drive systems, a given spindle may be aligned over its gripper, and lowered to place the tool in position in the spindle in the gripper. The gripper is then actuated to grip and hold the tool. The spindle is then moved in X and Y to position the tool magazine over the gripper to receive in an empty receptacle the tool removed from the spindle and now held by the gripper. Thereafter, the tool magazine is again repositioned to align a fresh tool over the gripper, now empty. The gripper picks the fresh tool, the tool magazine is moved away, and the spindle now moved over the gripper to take the fresh tool. The tool can be operated in the spindle at a laser runout check station, e.g. station 186A, and then another hole forming operation can proceed. This tool changing system is similar to the system described in U.S. Pat. No. 5,068,958, "Method and Apparatus for Changing Tools in an Automated Machine Tool," except that the magazines are carried by the spindles instead of by the overhead beam. Grippers and tool magazines suitable for the purpose are described in this patent, the entire contents of which are incorporated herein by this reference.

An advantage of the system is that tool changing operations for all spindles, including all spindles at each station, can be conducted simultaneously, thus reducing the amount of time needed for tool changing.

Figure 2:
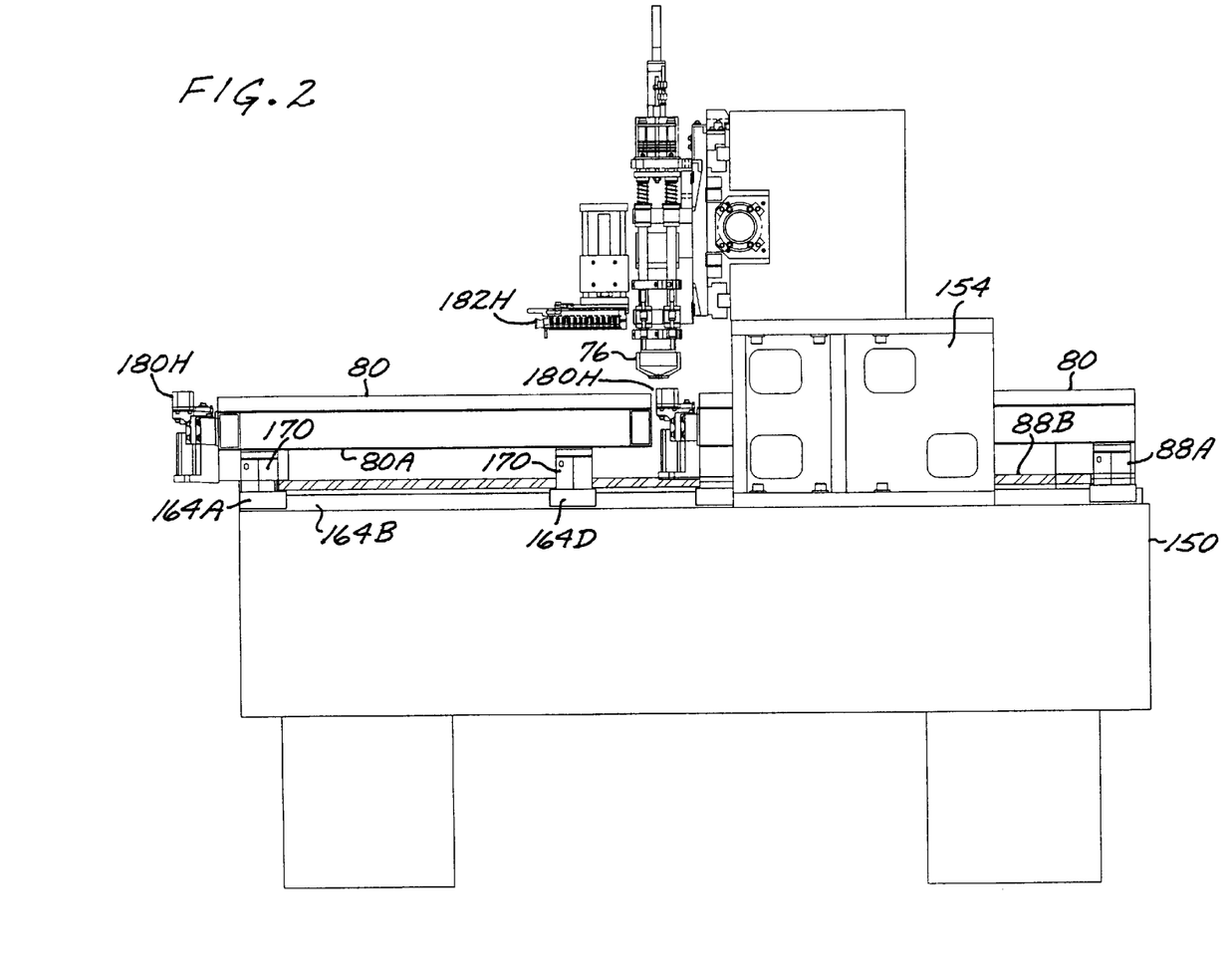
FIG. 2 is a side view of the drilling system of FIG. 1.

FIG. 2 is a right side view of the drilling system of FIG. 1, and further illustrates the arrangement of the architecture of the system. A Y-axis table drive system is employed to position the table along the Y axis. This drive system includes a servo motor 88A driving a leadscrew 88B, with the leadscrew nut (not shown) attached to the table 80. This Y-axis drive system is a conventional drive system.

The Y-axis table drive system moves the work piece table 80 precisely back and forth along the Y axis to precisely position the work pieces in one axis with respect to the spindles 62–76.

Figure 3:
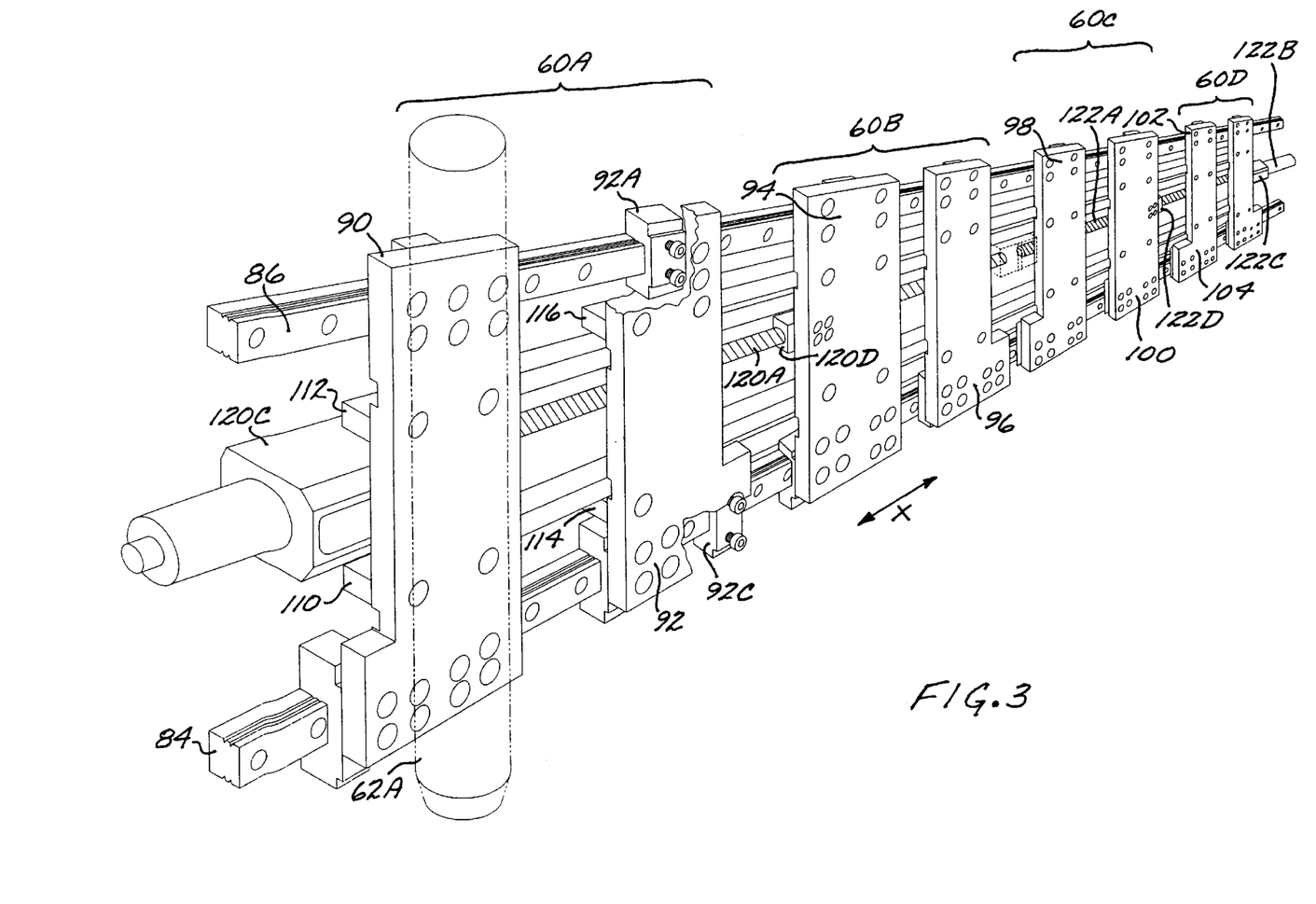
FIG. 3 is an isometric view of the X-axis drive system of the system of FIG. 1.

FIG. 3 is a functional diagram of the X-axis drive system for the system 50, which precisely positions the spindles along the X-axis. Each spindle has a Z-axis drive system mounted to a slide structure, and since there are eight spindles for the system of FIG. 1, there are also eight slide structures, with each station having a primary slide structure and a secondary slide structure. Thus, station 60A has associated therewith primary slide structure 90 and secondary slide structure 92, station 60B has primary slide structure 94 and secondary slide structure 96, station 60C has primary slide structure 98 and 100, and station 60D has primary slide structure 102 and secondary slide structure 104. For clarity, only one Z-axis spindle drive 62A (for spindle 62) is illustrated in a block form; the remaining spindle drives are not shown in FIG. 3.

The slide structures are each mounted on three roller guiding bearings for sliding movement along bearing guiding rails 84 and 86 which are mounted to the granite overhead beam 82. The rails 84 and 86 extend along the X-axis. Each slide structure has secured thereto two lower roller bearing slides for engaging the lower rail 84 and one upper roller bearing slide for engaging the upper rail 86. For example, slide 92 is secured to the lower rail 84 by lower roller bearing slides 92B and 92C, and to the upper rail 86 by upper bearing slide 92A. With the guiding rails and roller guiding bearings, the slide structures are all constrained for movement only along the X-axis. The roller guiding bearings are preloaded to increase stiffness and eliminate lost motion, improving guiding accuracy.

The system 50 includes two X-axis drive systems, one for driving the primary slide structures and the corresponding primary spindles, the other for driving the secondary slide structures and the corresponding secondary spindles. In this exemplary embodiment, each drive is a leadscrew drive. The primary slide structures are all ganged together by connection to primary spindle actuator bars 110 and 112, such that the primary slide structures 90, 94, 98 and 102 move in unison along the X-axis. The secondary slide structures are all ganged together by connection to secondary spindle actuator bars 114 and 116, such that the secondary slide structures 92, 96, 100 and 104 move in unison along the X-axis.

The primary spindle drive 120 includes the leadscrew 120A, motor drive 120B mounted within leadscrew housing 120C to the overhead beam 80, and the common primary drive attachment 120D, a leadscrew nut. The nut 120D is attached to one of the primary slide structures, in this embodiment to slide structure 94. This slide structure in turn pulls the other three slides 90, 98 and 102 along due to the common connection via the spindle actuator bars 110, 112. In a conventional manner, the leadscrew servo motors are attached to the leadscrews through couplings, e.g. coupling 120E (FIG. 1).

The secondary spindle drive includes the leadscrew 122A, motor drive 122B mounted within leadscrew housing 122C to the overhead beam 80, and the common secondary drive attachment nut 122D, attached to secondary slide structure 100.

Figure 4:
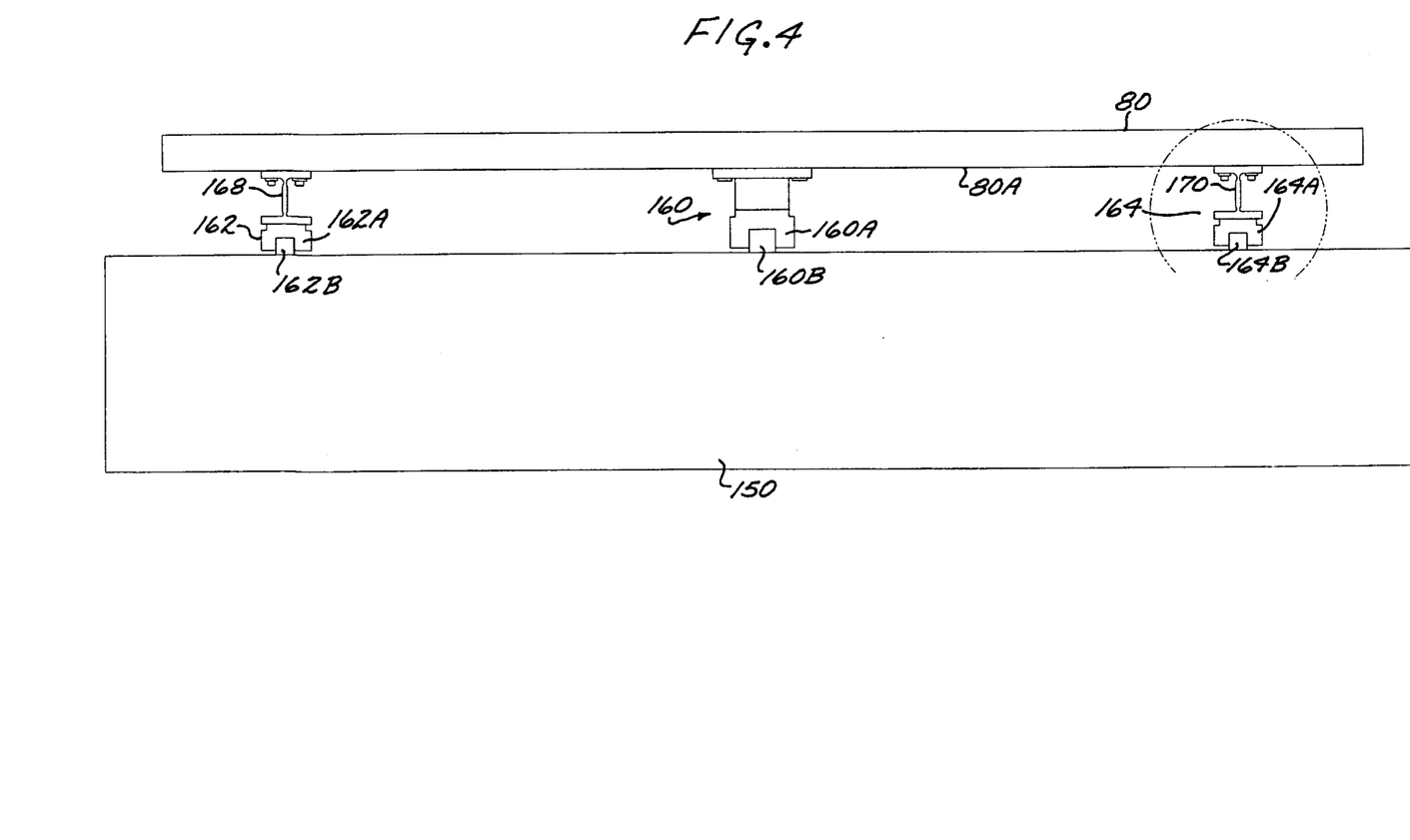
FIG. 4 is a simplified front view of the system of FIG. 1, illustrating the elements used in guiding the work piece table.

FIG. 4 is a simplified front view of the system 50, illustrating only elements used in guiding the work piece table 80. The table 80 in this exemplary embodiment is a laminated steel table, supported for movement along the Y axis by a master linear roller bearing 160 positioned centrally along the length of the table, i.e. centrally along the Y axis extent. Thus, a linear roller bearing slide 160A is secured to the undersurface 80A of the table 80, and a linear roller guiding rail 160B is secured to the base table 150. The bearing slide is preloaded against the rail to increase stiffness and improve accuracy. The rail 160B guides the top structure along a constrained linear path which extends along the Y axis.

Further supporting and guiding the table 80 as it is moved along are left and right outrigger linear roller bearings 162 and 164 which are positioned adjacent the left and right table ends 80L and 80R. These bearings include the front linear roller slides 162A and 164A, the rear linear roller slides 162C and 164C, (FIG. 2) and guiding rails 162B and 164B.

Since the system 50 has eight spindle stations, the table 80 has a considerable length along the Y axis to support work pieces processed by the different spindle stations. In this exemplary embodiment, this length is 96 inches. Because the table 80 is laminated steel, and the table 150 is granite, there will be differentials in the respective thermal expansion coefficients of the tables. With the table supported and constrained for movement along linear rails at each end 80L and 80R which extend along the Y axis, the linear roller 160, 162 and 164 provide extremely high guiding tolerances. The differential in thermal expansion rates of the tables over the temperature operating range of the system would create enormous stress on the bearings. This stress would result in bearing damage if the stress could not otherwise be relieved. Stress relief is provided in the following manner.

Figure 5:
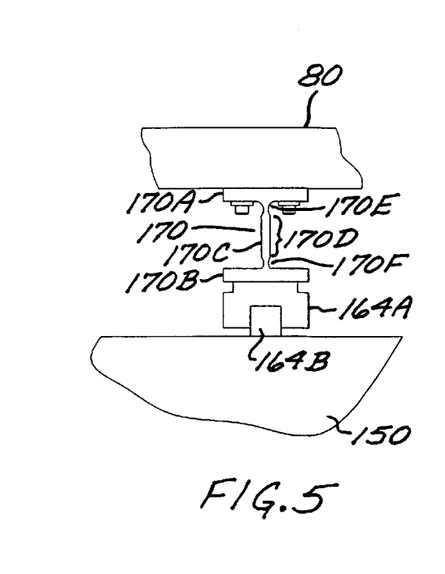
FIG. 5 shows one of the outrigger flexure mounts in further detail.

Outrigger flexure mounts 168 and 170 are employed to connect the respective front roller bearing slides 162A and 164A and the rear roller bearing slides 162D and 164D to the bottom surface 80A of the table 80. These flexure mounts are fabricated of a spring steel material. FIG. 5 shows flexure mount 170 in further detail; the other three flexure mounts are identical. The flexure mount has a generally I-shaped cross-section configuration. A flat top web portion 170A is secured to the bottom surface of the table by threaded fasteners. A flat bottom web portion 170B is connected to the bearing slide 164A, e.g. also by threaded fasteners. The top and bottom web portions are joined by a middle web portion 170C. The middle web portion has a relatively large thickness in the central part 170D, but a relatively thin dimension at 170E and 170F where the middle web portion connects to the top and bottom web portions, respectively. These relatively thin areas allow the mount 170 to flex or comply in response to differential thermal expansion rates between the work piece table 80 and the lower table 150, or to compensate for bearing rail misalignment. In an exemplary embodiment, the strut portion 170C has a height of 2.5 inches, with thickness dimensions of 0.260 inches at the strut region 170D and 0.093 inches at strut regions 170E and 170F.

Figure 6:
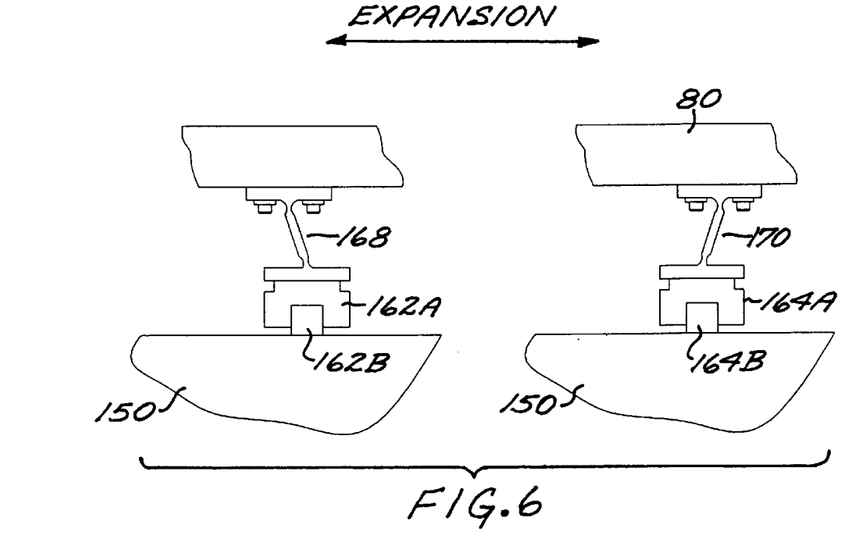
FIG. 6 illustrates an exaggerated compliance condition of the outrigger flexure mounts due to differential thermal expansion between the work piece and base tables and bearing rail misalignment.

FIG. 6 illustrates an exaggerated compliance condition of the outrigger flexure mounts due to differential thermal expansion between the tables 80 and 150. Assume that the table 80 has a higher expansion rate than the lower table 150. Instead of developing stress in the outrigger guide bearings, the flexure mounts flex at the regions of reduced thickness, as illustrated in exaggeration in FIG. 6. At the same time, the flexure mounts maintain stiffness in the Y and Z directions.

Figure 7:
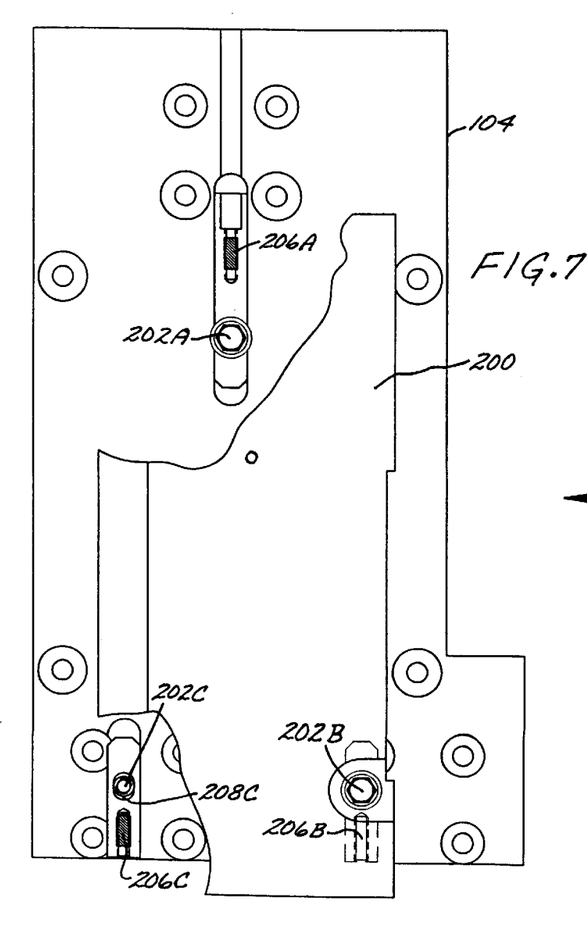
FIG. 7 shows a partially broken-away front view of exemplary slide 104 and the mounting structure which mounts the spindle 76 to the slide.
Figure 8:
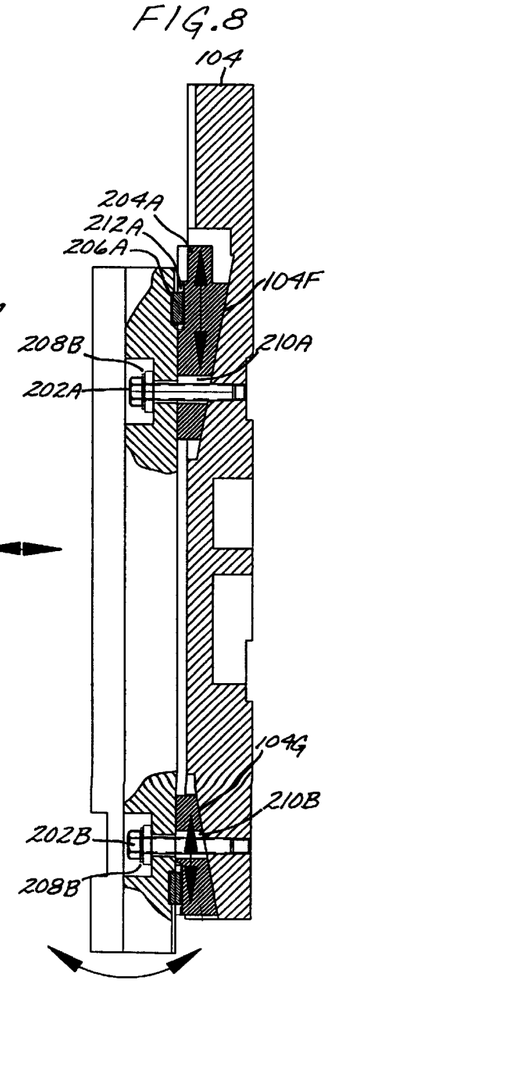
FIG. 8 is a partially broken-away side view of the structure of FIG. 7.
Figure 9:
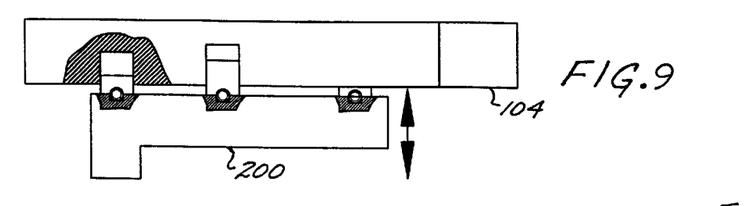
FIG. 9 is a partially broken-away top view of the structure of FIG. 7.

The spindles are mounted to the respective slides by a mounting structure employing a set of wedges, more particularly described in FIGS. 7–9. FIG. 7 shows a partially broken-away front view of exemplary slide 104 and the mounting structure which mounts the spindle 76 to the slide. One function of the wedge structure is to bring the spindle center line in line with the primary spindle 74 and X-axis travel. Another function is to make the spindle 74 perpendicular to the top table.

Each spindle drive assembly is carried by the X-axis guide assembly which includes the rails 84 and 86. Each spindle guide assembly mounting plate (plate 200 in FIG. 7) is attached to the corresponding X-axis slide (slide 104 in FIG. 7) through three threaded fasteners (fasteners 202A–200C in FIG. 7). Each fastener is threaded through a slot in a corresponding wedge block which acts on a corresponding incline surface formed in the slide. The wedges can be moved up and down the incline plane surfaces.

There are three fasteners and wedges to provide a three-point suspension for the spindle mounting plate. As shown in the side cross-sectional view of FIG. 8, fastener 202A is threaded through a slot 210A formed in wedge block 204A, which acts on incline surface 104F. Fastener 202B is threaded through slot 210B formed in wedge block 204B, which acts on incline surface 104G. While not visible in FIG. 8, fastener 202C is threaded through a slot 210C formed in wedge 204C, which acts on incline surface 104H. The top wedge and bottom wedges are reversed in direction for easy access to adjustment set screws 206A–206C. The adjustment set screws 206A–206C are captured in cutouts 208A–208C slightly larger than the lengths of the set screw and equivalent in width to ⅛ diameter. In the wedge there is a one half diameter threaded hole which will propel the wedge up and down depending on the direction the set screw is turned.

The wedges can be moved by the set screws. By rotating the set screws, the wedges are forced to move in the incline defined by the incline surfaces. This movement causes the spindle plate to move front to back in the of the wedge which is being manipulated. Moving each wedge in different amounts allows the tilt of the spindle plate to be adjusted. By moving each wedge the same amount in the proper direction, the front to back location of the spindle plate can be adjusted. The wedges and set screws are under constant compression load during the adjustment. The compression load is applied by wave springs 208A–208C which are located under each mounting bolt head. When all adjustments are complete, the spindle plate is locked down to the carriage plate by tightening the bolts which attach the spindle plate to the slide.

This method of attachment of the spindle drive mounting plates to the slides allows the alignment of two spindles working on one station in line with the X-axis travel. This also allows correction for perpendicularity of the spindle to the table 80. Thus, the spindle plate mounting structure shown in FIGS. 7–9 is used to adjust a spindle so that its centerline would be perpendicular to a plate on the table 80 which would hold a piece of material that the spindle would drill.

It is further necessary to adjust the relative position of each secondary spindle to the corresponding primary spindle along the X axis. This can be accomplished by drilling a hole with each spindle at a known programmed distance, and measuring the distance between the drilled holes and comparing the measured value to the programmed value to obtain an error distance. The adjustment to correct the error distance is accomplished by untightening the slide of one of the spindles from the actuator rods, and adjusting the spindle location, monitoring the distance moved with a dial indicator of proper measurement accuracy. When the error adjustment is complete, the slide is reattached to the actuator rods.

To further increase the system throughput according to a further aspect of the invention, the spindles 62–76 include high RPM spindle drives. In an exemplary embodiment, the spindle drives operate at a maximum rate of 150,000 RPM. This is in contrast with typical drilling spindle maximum rates on the order of 110,000 RPM. Use of high RPM spindles allows faster feed rates and prolongs drill life. A faster feed rate will improve machine productivity considerably, in some cases by 25% or more. High RPM spindle drives suitable for the purpose are available commercially.

A problem with such high RPM spindles is that they do not have sufficient power to reliably produce large holes, say larger than 0.125 inches. Moreover, the high speed spindles available today are incapable of producing large holes because the linear thrust bearings employed in the spindles are inadequate. In accordance with a further feature of the invention, such large holes are produced by the system by a routing technique using a router tool. All holes larger than a given threshold size, e.g. 0.1249 inches, are produced by the routing technique. There are many router tools that could be employed for this purpose. It is desirable that the outer diameter of the router tool be controlled to a tight tolerance. For an exemplary embodiment, the router tool outer diameter is 0.062 plus/minus 0.002 inches.

A laser diameter check determines router size, and applies the proper offset to compensate for size and bit defection. Laser equipment suitable for the purpose is well known in the art.

Figure 10:
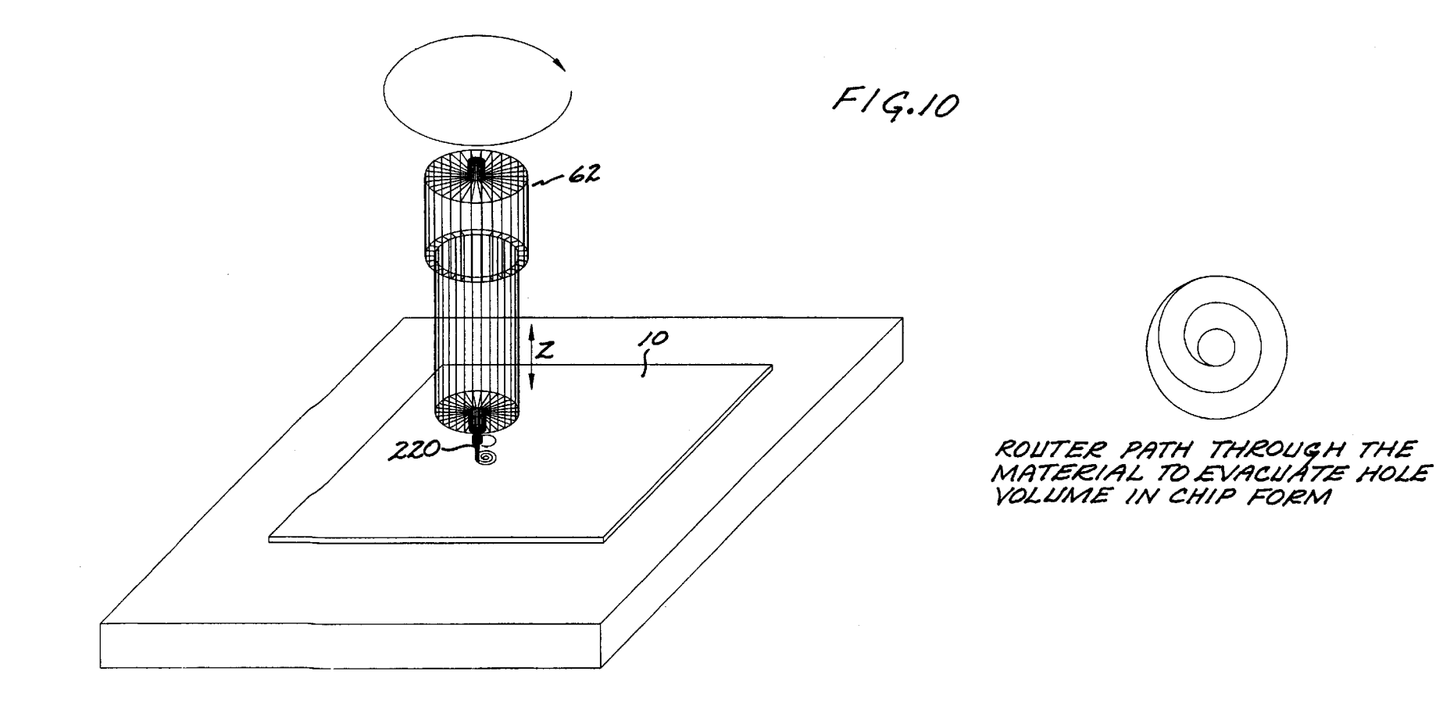
FIG. 10 shows in a simplified isometric view the use of a router tool to form a hole in accordance with an aspect of the invention.

FIG. 10 shows in a simplified isometric view the use of a router tool to form a hole in accordance with this aspect of the invention. Here, exemplary high speed spindle 62 carries a router tool 220. Instead of producing a hole by simply feeding the tool into the work piece 10 vertically down and then up along the Z axis in a typical drilling sequence, a routing sequence is employed. The tool is still fed into the work piece vertically to route a small hole, and then, with the spindle in the down position and the tool rotating at high speed, moved in X and Y through a spiral path. The spiral path results in the formation of a larger hole than the diameter of the tool 220, and yet still forms tiny chips instead of a plug of material. The spiral path is achieved by motion of the spindle and table 80 in X and Y to create the spiral motion of the router tool.

Forming large holes using this routing technique will eliminate the need for stocking large diameter drill sizes, since all large holes, e.g. holes with diameters exceeding 0.125 in an exemplary embodiment, will be formed with a single router tool. A tool diameter size suitable for the purpose is 0.062 inches. It is desirable that the outer diameter of the router tool be controlled to a tight tolerance. For this exemplary embodiment, the router tool outer diameter is 0.062 plus/minus 0.002 inches. In addition, tool changes for large drills will be eliminated, since a single router tool can be used.

Figure 11:
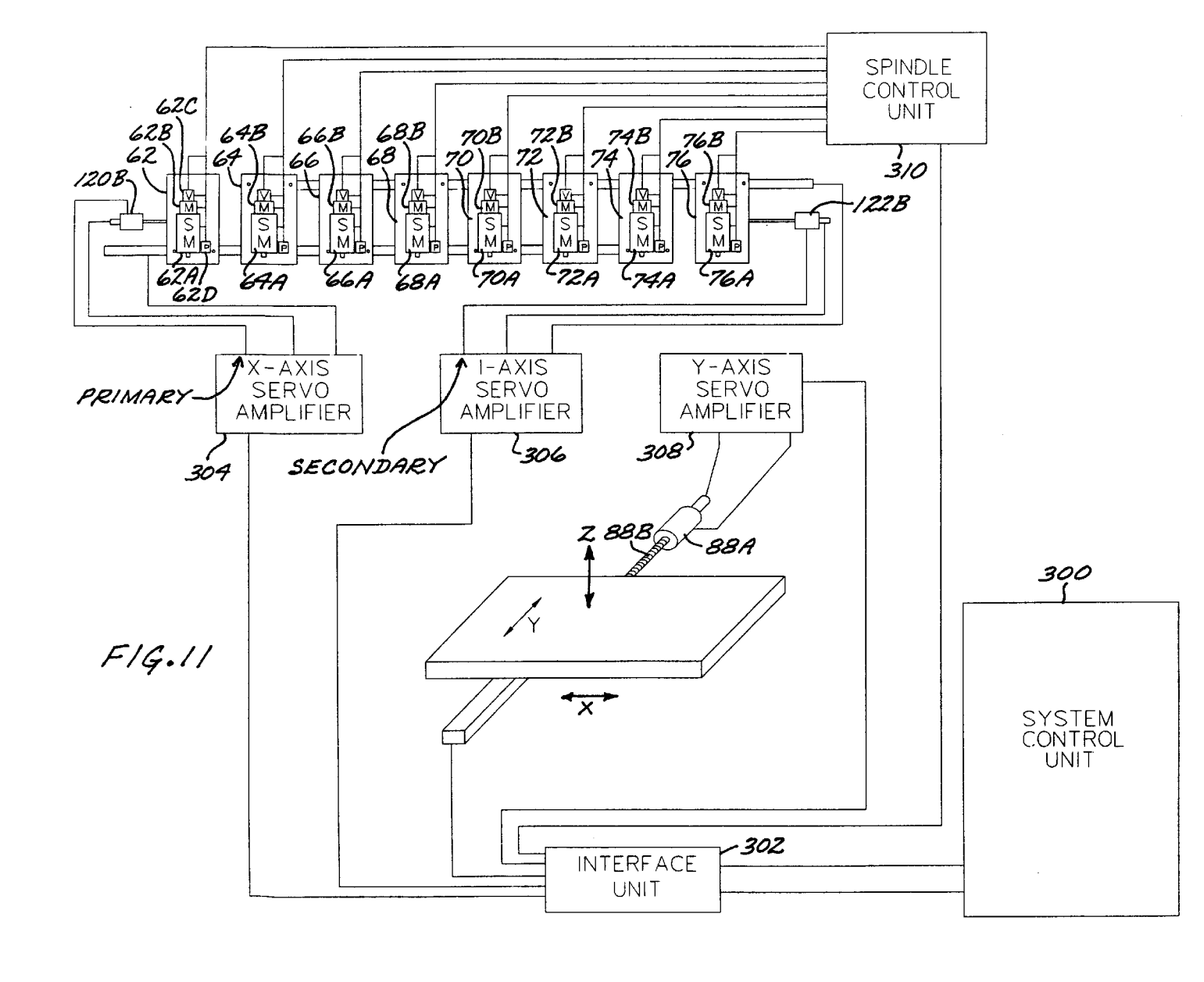
FIG. 11 is a simplified diagrammatic diagram of the control system for the system.

FIG. 11 is a simplified diagrammatic diagram of the control system for the system 50. The control system includes a system control unit 300, an interface unit 302, a primary X-axis servo amplifier 304, a secondary X-axis servo amplifier 306, a Y-axis servo amplifier 308, and a spindle control unit 310. The amplifier 304 provides drive signals to the primary servo drive motor 120B. The amplifier 306 provides drive signals to the secondary servo drive motor 122B. In addition, each servo amplifier receives position feedback signals.

The spindle control unit provides control signals to the spindle rotary drive motors 62A–76A and to the linear motors 62B–76B which provide Z-axis drive to the spindles. In addition, the spindles each have velocity and position feedback sensors, e.g. velocity sensor 62C and position sensor 62D for spindle 62.

Figure 12:
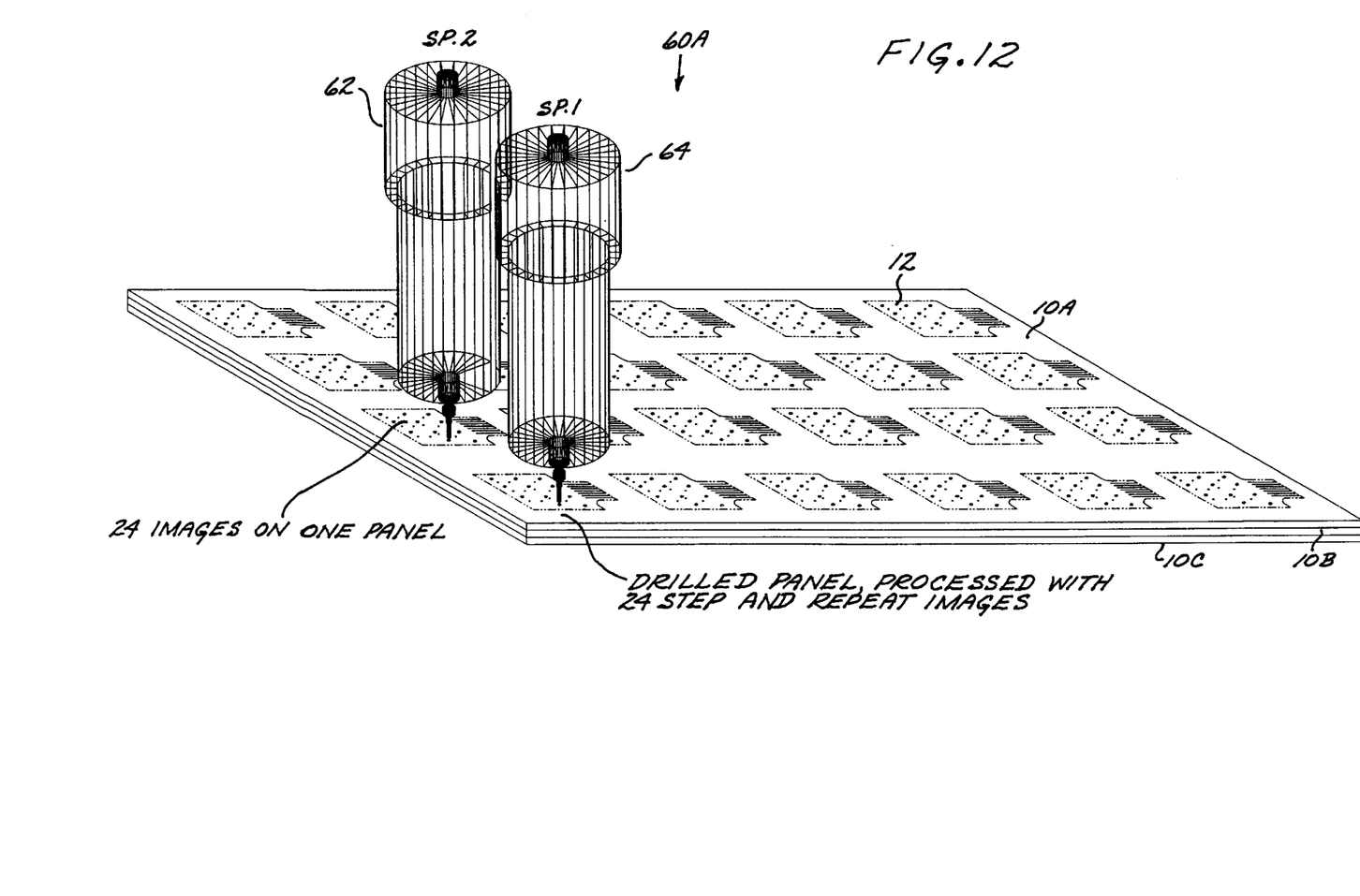
FIG. 12 is a simplified isometric view of a multiple spindle hole forming operation on a multiple image work piece.

FIG. 12 is a simplified isometric view of a multiple spindle hole forming operation on a multiple image work piece. Here the work piece is a stack of three identical panels 10A–10C, each having 24 identical images 12 formed thereon. The spindles are positioned and controlled to simultaneously form identical holes on corresponding locations in the repeated images. To simplify tool changing and movement of the primary and secondary X-axis drives, each spindle is using identical tools to form corresponding holes in the images. With three panels stacked, three panels are processed simultaneously.

The controller software control takes input data specifying locations and sizes of all holes to be formed for the work piece, and assigns holes to each spindle, as well as the sequence in forming the holes. In general, the work piece is divided into two halves, and holes on one side are assigned to the spindle for that half of the work piece, although holes in a central region can be assigned to either spindle. The controller software control also includes anti-collision functions to ensure that adjacent spindles do not collide during hole forming operations.

The drilling system described herein provides significant productivity improvements as compared to known four spindle systems. This can be illustrated by the following example. Consider a typical printed circuit board panel, having 12,000 holes to be formed, with 12 different hole sizes. There would typically be 20 tool changes, including 8 drill changes of the same size tool, consuming about 10 minutes. With an average hit rate of 150 per minute, the running time for the panel will be about 80 minutes, i.e. 70 minutes for drilling and 10 minutes for the tool changes.

With the new machine, with two spindles per station, the running time for hole drilling/forming will be cut in half, from 70 minutes to 35 minutes. The time required for tool changing is reduced, e.g. from 10 minutes to 6 minutes, thus providing a total running time of 41 minutes. This is just the productive improvement contribution from using two spindles per station.

Using a high RPM spindle at each station provides a further productivity improvement. An exemplary 150,000 RPM spindle speed will provide a drill cycle time reduction of about 28% in one example. This could reduce the 35 minute drill running time computed above by 9.8 minutes. This would produce a 25.2 minute drill running time, plus the 6 minute tool changing time, or a total running time of 31.2 minutes.

Using a router tool to form all large diameter holes produces a further productivity improvement. In a typical board panel, several tool changes could be eliminated, perhaps as many as 8, reducing tool changing time by as much as 4 minutes. This could further reduce the total running time to 31.2 minutes minus 4 minutes, to 27.2 minutes.

Figure 13:
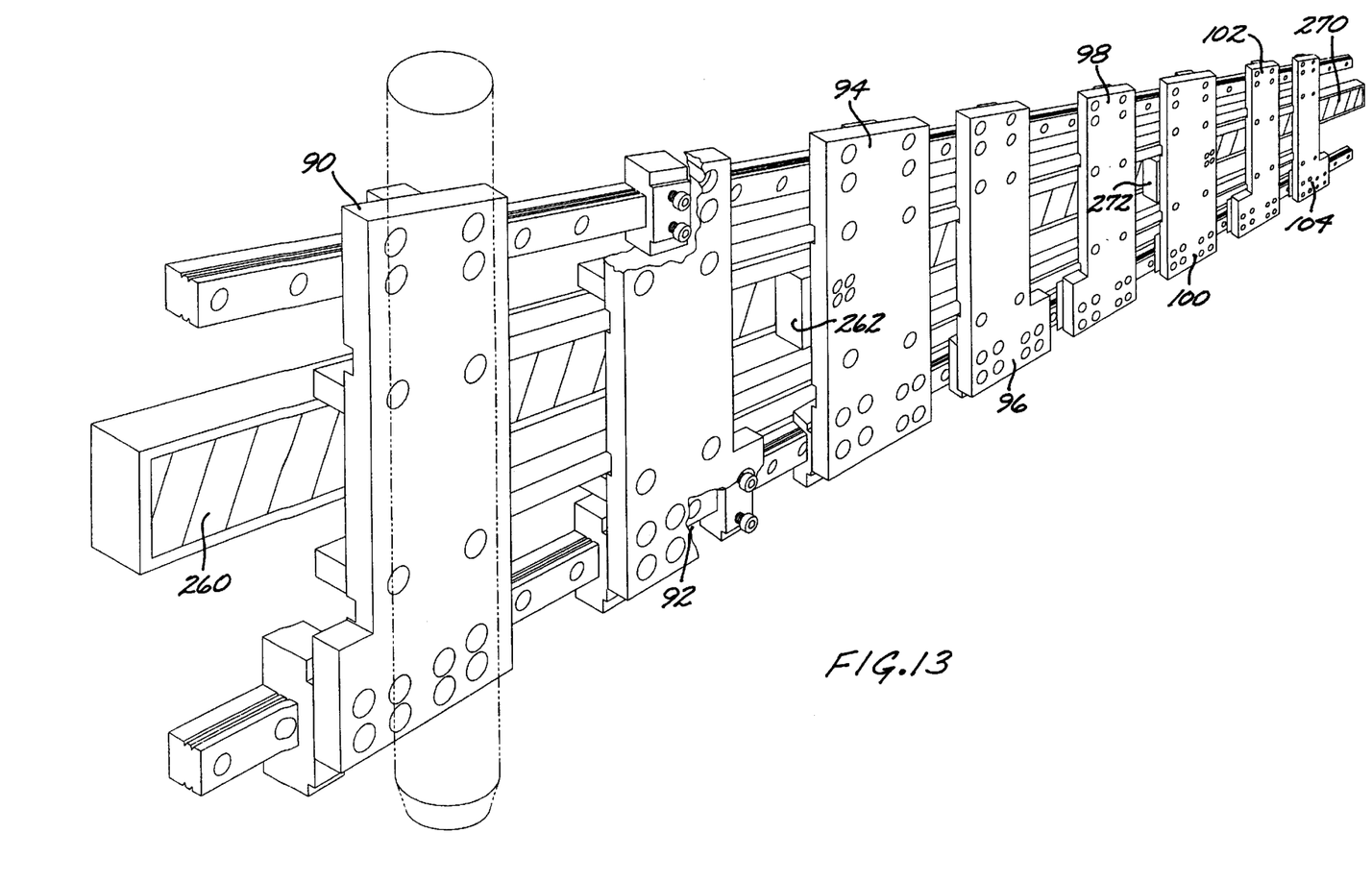
FIG. 13 is a simplified diagrammatic illustration of an alternate X-axis drive system.

In an alternate embodiment, the X axis spindle drive is actuated by a linear electric motor drive. This embodiment is illustrated in FIG. 13. Here the primary leadscrew drive of FIG. 3 has been replaced with a linear motor including stationary magnet assembly 260 which interacts with coil assemblies secured to each primary slider 90, 94, 98 and 102. Only coil assembly 262 secured to slider 94 is shown in FIG. 7. Similarly, the secondary leadscrew drive of FIG. 3 has been replaced with a linear motor including stationary magnet assembly 270 which interacts with coil assemblies secured to each secondary slider 92, 96, 100, 104. Exemplary coil assembly 272 is shown as secured to slider 100 in FIG. 13. The advantages of a linear motor in relation to a leadscrew drive include the increased stiffness of the linear motor, allowing the system to be driven faster and more accurately. Also, there are no components to wear out in a linear motor, in comparison to the mechanical leadscrew components.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A hole forming system for forming holes in a work piece under automated control, comprising:
   a base table;
   a work piece table for supporting work pieces under process;
   a Y axis drive system for moving the work piece table along a Y axis in relation to the base table;
   a spindle including a rotary drive for rotating a tool at very high speed during hole forming operations;
   an X axis drive system for driving said spindle along an X axis which is orthogonal to said Y axis;
   Z axis drive system for driving said spindle along a Z axis which is orthogonal to said X and Y axis;
   a tool changer for holding one or more drilling tools and a router tool for selective use in the spindle during hole forming operations;
   a controller for controlling the X axis, Y axis and Z axis drive systems, said spindle rotary drive and said tool changer for selecting an appropriate tool for hole forming operations and executing said hole forming operations, wherein said system is controlled to use a drilling tool to form holes having an outer diameter under a predetermined threshold diameter by rotating the drilling tool at very high speed and feeding the drilling tool into and out of the work piece along a single Z axis, and to use a router tool to form holes having an outer diameter exceeding the threshold diameter by a routing movement.

2. The system of claim 1 wherein said spindle is capable of rotary spindle rates of 150,000 revolutions per minute.

3. The system of claim 2 wherein said predetermined threshold diameter is about 0.125 inches.

4. The system of claim 1 wherein said routing movement includes a spiral movement of the rotating router in a plane transverse to the Z axis.

5. The system of claim 1 wherein a single router tool is employed to form all holes having a diameter exceeding said threshold diameter, thereby minimizing tool changes.

6. A method for forming holes in a work piece, comprising a sequence of the following steps:
   providing a spindle capable of very high rotational drive rates and a linear drive, for rotating a tool and feeding the tool into and out of a work piece;
   providing a selection of tools including a set of drilling tools of various diameters, and at least one router tool;
   using one or more tools of the set of drilling tools to drill a set of holes in a work piece having diameters less than a predetermined threshold diameter size; and
   using said router tool to form one or more holes of diameters larger than the threshold diameter in a routing operation.

7. The method of claim 6 wherein said routing operation includes feeding the rotating router tool into the work piece, with the tool still rotating in the work piece, providing relative movement between the tool and the work piece to move the router tool through a path transverse to the spindle axis.

8. The method of claim 7 wherein the transverse path is a spiral path.

9. The method of claim 6 wherein said spindle is capable of rotary spindle rates of 150,000 revolutions per minute.

10. The method of claim 9 wherein said predetermined threshold diameter is about 0.125 inches.

* * * * *